US009520238B2

(12) United States Patent
Lee et al.

(10) Patent No.: US 9,520,238 B2
(45) Date of Patent: Dec. 13, 2016

(54) ARRAY-TYPE MULTILAYER CERAMIC ELECTRONIC COMPONENT AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Jae Hoon Lee, Suwon-Si (KR); Dae Bok Oh, Suwon-Si (KR); Jae Young Park, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 329 days.

(21) Appl. No.: 14/262,282

(22) Filed: Apr. 25, 2014

(65) Prior Publication Data

US 2015/0115893 A1    Apr. 30, 2015

(30) Foreign Application Priority Data

Oct. 25, 2013 (KR) .................. 10-2013-0127778
Dec. 17, 2013 (KR) .................. 10-2013-0156986

(51) Int. Cl.
*H02J 7/00* (2006.01)
*H01G 4/30* (2006.01)
(Continued)

(52) U.S. Cl.
CPC ............. *H01G 4/30* (2013.01); *H01G 4/012* (2013.01); *H01G 4/12* (2013.01); *H01G 4/232* (2013.01);
(Continued)

(58) Field of Classification Search
CPC .......... H01G 4/30; H01G 4/385; H01G 4/232; H01G 4/12; H01G 4/012; H05K 1/181; H05K 2201/10015; Y02P 70/611
(Continued)

(56) References Cited

U.S. PATENT DOCUMENTS 6,252,761 B1* 6/2001 Branchevsky .... H01L 23/49822
257/E23.062
6,441,459 B1* 8/2002 Togashi .................. H01G 4/30
257/532

(Continued)

FOREIGN PATENT DOCUMENTS

JP      2013-131548 A   7/2013
KR   10-2005-0044083 A  5/2005

*Primary Examiner* — Jack Chiang
*Assistant Examiner* — Brandon Bowers
(74) *Attorney, Agent, or Firm* — McDermott Will & Emery LLP

(57) ABSTRACT

An array-type multilayer ceramic electronic component includes a ceramic body including a plurality of first dielectric layers and a plurality of second dielectric layers, first and second internal electrodes disposed on the first dielectric layers and facing each other, third and fourth internal electrodes disposed on the second dielectric layers and facing each other, a first external electrode disposed on a first end surface of the ceramic body and connected to the first internal electrode, a second external electrode disposed on a first side surface of the ceramic body and connected to the second internal electrode, a third external electrode disposed on a second end surface of the ceramic body and connected to the third internal electrode, and a fourth external electrode disposed on a second side surface of the ceramic body and connected to the fourth internal electrode.

10 Claims, 11 Drawing Sheets

(51) Int. Cl.
*H05K 1/18* (2006.01)
*H01G 4/012* (2006.01)
*H01G 4/38* (2006.01)
*H01G 4/12* (2006.01)
*H01G 4/232* (2006.01)

(52) U.S. Cl.
CPC .............. *H01G 4/385* (2013.01); *H05K 1/181* (2013.01); *H05K 2201/10015* (2013.01); *Y02P 70/611* (2015.11)

(58) Field of Classification Search
USPC ........................................................ 320/135
See application file for complete search history.

(56) References Cited

U.S. PATENT DOCUMENTS

| | | | |
|---|---|---|---|
| 6,765,781 B2 * | 7/2004 | Togashi | H01G 4/30 361/303 |
| 9,240,281 B2 * | 1/2016 | Park | H01G 4/385 |
| 2013/0026852 A1 * | 1/2013 | Engel | H01C 7/04 307/109 |

* cited by examiner

ARRAY-TYPE MULTILAYER CERAMIC ELECTRONIC COMPONENT AND BOARD HAVING THE SAME MOUNTED THEREON

CROSS-REFERENCE TO RELATED APPLICATION

This application claims priority to, and benefit of Korean Patent Application No. 10-2013-0127778 filed on Oct. 25, 2013, and Korean Patent Application No. 10-2013-0156986 filed on Dec. 17, 2013, with the Korean Intellectual Property Office, the entire contents of which are hereby incorporated by reference.

TECHNICAL FIELD

The present disclosure relates to an array-type multilayer ceramic electronic component and a board having the same mounted thereon.

BACKGROUND

Electronic components using a ceramic material include capacitors, inductors, piezoelectric elements, varistors, thermistors, and the like.

Among these ceramic electronic components, multilayer ceramic capacitors (MLCCs) have advantages such as a small size, high capacitance, easiness of mounting, and the like.

Multilayer ceramic capacitors are chip-shaped condensers mounted on circuit boards of various electronic products such as display devices (for example, liquid crystal displays (LCDs), plasma display panels (PDP), and the like), computers, personal digital assistants (PDA), mobile phones, and the like, to serve to be charged with electricity or discharge electricity.

Such a multilayer ceramic capacitor is manufactured by alternately stacking a plurality of dielectric layers and internal electrodes to form a multilayer body, sintering this multilayer body, and installing external electrodes. Generally, capacitance of the multilayer ceramic capacitor is determined according to the amount of stacked internal electrodes.

In order to mount the multilayer ceramic capacitor on a printed circuit board, a predetermined area is required.

In the case of mounting a plurality of multilayer ceramic capacitors having various electric properties on a single printed circuit board, a predetermined amount of space should be secured in order to properly operate each of the multilayer ceramic capacitors.

Recently, as electronic products have been miniaturized, microminiaturization and super high capacitance have been required in the multilayer ceramic capacitors used in electronic products.

However, when electronic products are slimmed and miniaturized, a space for mounting a multilayer ceramic capacitor therein is limited, so that product design may be problematic.

Therefore, in order to simultaneously mount a plurality of multilayer ceramic capacitors having various electric properties on a single printed circuit board, there are limitations in miniaturizing electronic products.

SUMMARY

An aspect of the present disclosure may provide an array-type multilayer ceramic electronic component and a board having the same mounted thereon.

One aspect of the present disclosure relates to an array-type multilayer ceramic electronic component including: a ceramic body including a plurality of first dielectric layers and a plurality of second dielectric layers in a thickness direction and having first and second main surfaces opposing each other in the thickness direction, first and second side surfaces opposing each other in a width direction, and first and second end surfaces opposing each other in a length direction, first and second internal electrodes disposed on the plurality of first dielectric layers and facing each other with one of the plurality first dielectric layers interposed between the first and second internal electrodes; third and fourth internal electrodes disposed on the plurality of second dielectric layers and facing each other with one of the plurality of second dielectric layer between the third and fourth internal electrodes, a first external electrode disposed on the first end surface of the ceramic body and connected to the first internal electrode, a second external electrode disposed on the first side surface of the ceramic body and connected to the second internal electrode, a third external electrode disposed on the second end surface of the ceramic body and connected to the third internal electrode, and a fourth external electrode disposed on the second side surface of the ceramic body and connected to the fourth internal electrode.

The first dielectric layers and the first and second internal electrodes may form a first capacitor part, and the second dielectric layers and the third and fourth internal electrodes may form a second capacitor part.

The second dielectric layers may be disposed below the first dielectric layers in the thickness direction.

The first internal electrode may include a first lead portion exposed to the first end surface, the second internal electrode may include a second lead portion exposed to the first side surface, the third internal electrode may include a third lead portion exposed to the second end surface, and the fourth internal electrode may include a fourth lead portion exposed to the second side surface.

The number of stacked first dielectric layers and the number of stacked second dielectric layers may be different from each other.

The first and second dielectric layers may contain different materials.

The first and second dielectric layers may have different thicknesses.

Another aspect of the present disclosure encompasses an array-type multilayer ceramic electronic component including a body, a first signal electrode, a second signal electrode, a first ground electrode and a second ground electrode. The body has a hexahedral shape and includes a first capacitor part and a second capacitor part coupled to the first capacitor part. The first capacitor part includes a plurality of first dielectric layers, a plurality of first internal electrodes, and a plurality of second internal electrodes. The second capacitor part is disposed below the first capacitor part in a thickness direction and includes a plurality of second dielectric layers and third and fourth internal electrodes. The first signal electrode is disposed on a first end surface of the body and connected to the first internal electrodes. The first ground electrode is disposed on a first side surface of the body and connected to the second internal electrodes. The second signal electrode is disposed on a second end surface of the body and connected to the third internal electrodes. The second ground electrode is disposed on a second side surface of the body and connected to the fourth internal electrodes.

A lowermost internal electrode of the first capacitor part may be one of the second internal electrodes, and an uppermost internal electrode of the second capacitor part may be one of the fourth internal electrodes.

A lowermost internal electrode of the first capacitor part may be one of the second internal electrodes, an uppermost internal electrode of the second capacitor part may be one of the fourth internal electrodes, and the lowermost internal electrode of the first capacitor part and the uppermost internal electrode of the second capacitor part may face each other, having a dielectric layer therebetween.

The first and second capacitor parts may be configured to independently operate.

The first and second capacitor parts may have different capacitance.

The first and second capacitor parts may have respective current directions opposite to each other.

The first and second internal electrodes may be disposed on the plurality of first dielectric layers so as to face each other, having one of the first dielectric layers therebetween, and the third and fourth internal electrodes may be disposed on the plurality of second dielectric layers so as to face each other, having one of the second dielectric layers therebetween.

The first internal electrodes may include a first lead portion exposed to the first end surface, the second internal electrodes may include a second lead portion exposed to the first side surface, the third internal electrodes may include a third lead portion exposed to the second end surface, and the fourth internal electrodes may include a fourth lead portion exposed to the second side surface.

Still another aspect of the present disclosure relates to an array-type multilayer ceramic electronic component including a body, a first signal electrode, a second signal electrode, a first ground electrode, and a second ground electrode. The body has a hexahedral shape and includes a first capacitor part and a second capacitor part coupled to the first capacitor part. The first capacitor part stabilizes first power supplied from a battery to supply the stabilized power to a power management unit. The second capacitor part is disposed below the first capacitor part, is supplied with second power converted by the power management unit, and stabilizes the supplied second power to supply driving power. The first signal electrode is disposed on a first end surface of the body and connected to the battery to transfer the first power to the first capacitor part. The second signal electrode is disposed on a second end surface of the body and connected to the power management unit to transfer the second power to the second capacitor part. The first ground electrode is disposed on a first side surface of the body to ground the first capacitor part. The second ground electrode is disposed on a second side surface of the body to ground the second capacitor part.

The first capacitor part may include a plurality of first dielectric layers, a plurality of first internal electrodes, and a plurality of second internal electrodes. The second capacitor part may include a plurality of second dielectric layers, a plurality of third internal electrodes, and a plurality of fourth internal electrodes.

The first internal electrodes may be connected to the first signal electrode, the second internal electrodes may be connected to the first ground electrode, the third internal electrodes may be connected to the second signal electrode, and the fourth internal electrodes may be connected to the second ground electrode.

A lowermost internal electrode of the first capacitor part may be one of the second internal electrodes, and an uppermost internal electrode of the second capacitor part may be one of the fourth internal electrodes.

Another aspect of the present disclosure encompasses an array-type multilayer ceramic electronic component including a body, a first signal electrode, a second signal electrode, a first ground electrode and a second ground electrode. The body has a hexahedral shape and includes a first capacitor part and a second capacitor part coupled to the first capacitor part. The first capacitor part supplied with first power converted by a power management unit converts power supplied from a battery and stabilizes the supplied first power to supply driving power. The second capacitor part supplied with second power converted by the power management unit stabilizes the supplied second power to supply driving power are coupled to each other. The first signal electrode is disposed on a first end surface of the body and connected to the power management unit to transfer the first power to the first capacitor part. The second signal electrode is disposed on a second end surface of the body and connected to the power management unit to transfer the second power to the second capacitor part. The first ground electrode is disposed on a first side surface of the body to ground the first capacitor part. The second ground electrode is disposed on a second side surface of the body to ground the second capacitor part.

A board having an array-type electronic component mounted thereon may include a printed circuit board having three or more electrode pads disposed thereon, and the array-type multilayer ceramic capacitor as described above disposed on the printed circuit board, and a solder connecting the three or more electrode pads and the array-type multilayer ceramic capacitor.

Still another aspect of the present disclosure relates to an array-type multilayer ceramic electronic component including a ceramic body, first and second internal electrodes, third and fourth internal electrodes, a first external electrode, a second external electrode, a third external electrode and a fourth external electrode. The ceramic body includes a plurality of first dielectric layers and a plurality of second dielectric layers stacked in a thickness direction. The first and second internal electrodes are disposed on the plurality of first dielectric layers and face each other with one of the plurality of first dielectric layers interposed between the first and second internal electrodes. The third and fourth internal electrodes are disposed on the plurality of second dielectric layers and face each other with one of the plurality of second dielectric layers interposed between the third and fourth internal electrodes. The first, second, third and fourth external electrodes are connected to the first, second, third and fourth internal electrodes, respectively. The first and second external electrodes are connected to form a first current path and disposed on surfaces of the ceramic body adjacent to each other. The third and fourth external electrodes are connected to form a second current path and disposed on surfaces of the ceramic body adjacent to each other.

The ceramic body may have first and second main surfaces opposing each other in the thickness direction, first and second side surfaces opposing each other in a width direction, and first and second end surfaces opposing each other in a length direction.

The second dielectric layers may be disposed below the first dielectric layers in the thickness direction.

The first internal electrode may include a first lead portion exposed to the first end surface. The second internal electrode may include a second lead portion exposed to the first side surface. The third internal electrode may include a third lead portion exposed to the second end surface. The fourth internal electrode may include a fourth lead portion exposed to the second side surface.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
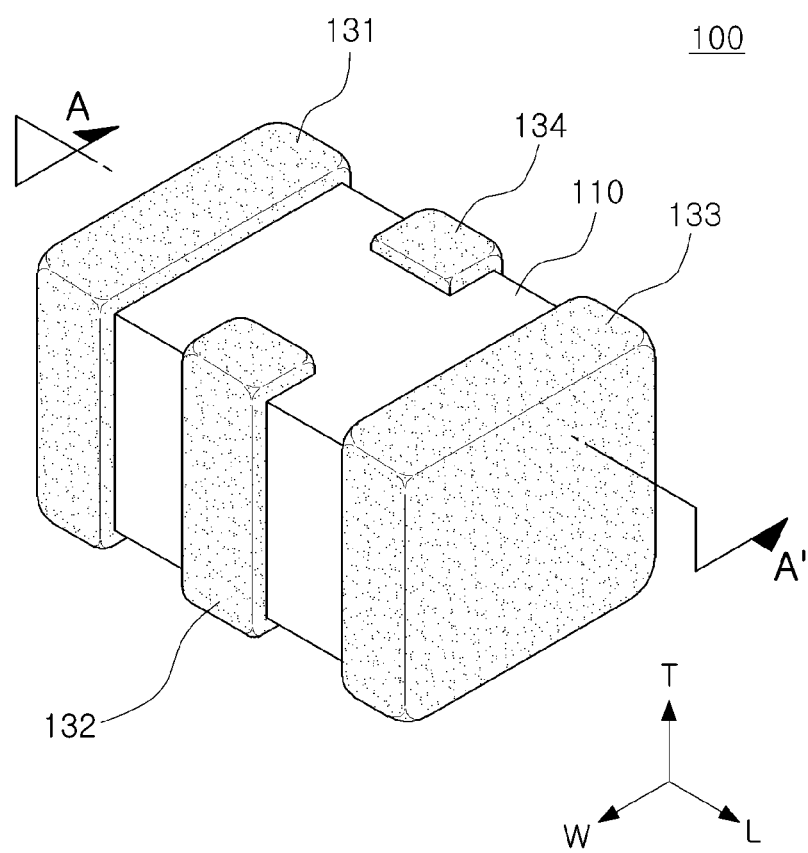
FIG. 1 is a perspective diagram schematically showing an array-type multilayer ceramic electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Hereinafter, an array-type multilayer ceramic electronic component according to an exemplary embodiment of the present disclosure, in detail, an array-type multilayer ceramic capacitor will be described, but the present disclosure is not limited thereto.

Array-Type Multilayer Ceramic Electronic Component 100

Figure 2:
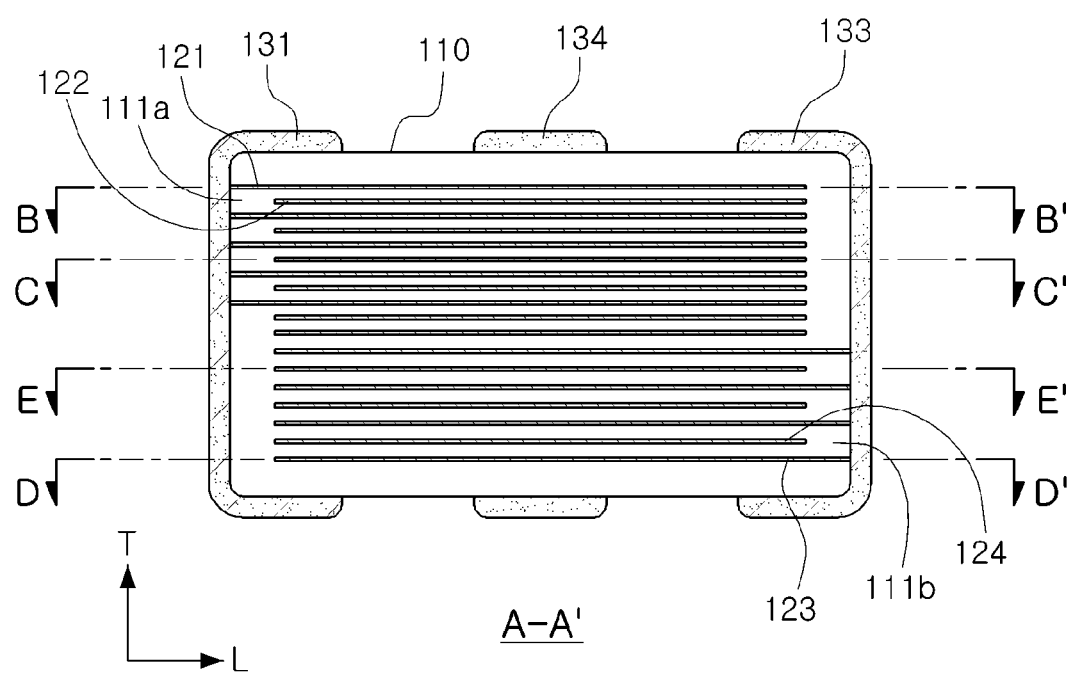
FIG. 2 is a cross-sectional diagram taken along line A-A' of FIG. 1.

FIG. 1 is a perspective diagram schematically showing an array-type multilayer ceramic electronic component 100 according to an exemplary embodiment of the present disclosure, and FIG. 2 is a cross-sectional diagram taken along line A-A' of FIG. 1.

Figure 3:
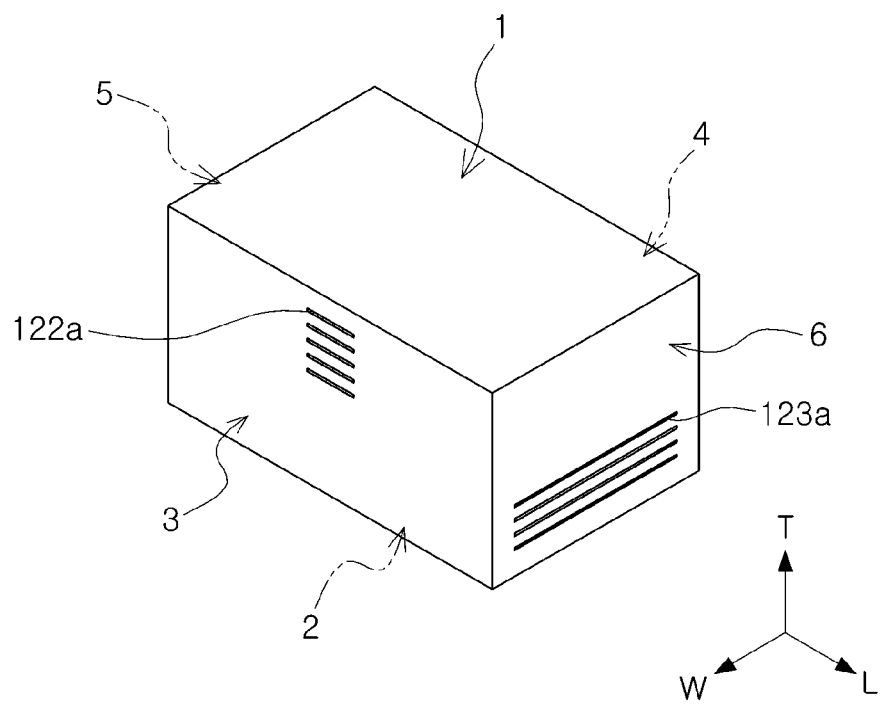
FIG. 3 is a perspective diagram schematically showing a ceramic body of an array-type multilayer ceramic electronic component according to an exemplary embodiment of the present disclosure.
Figure 4:
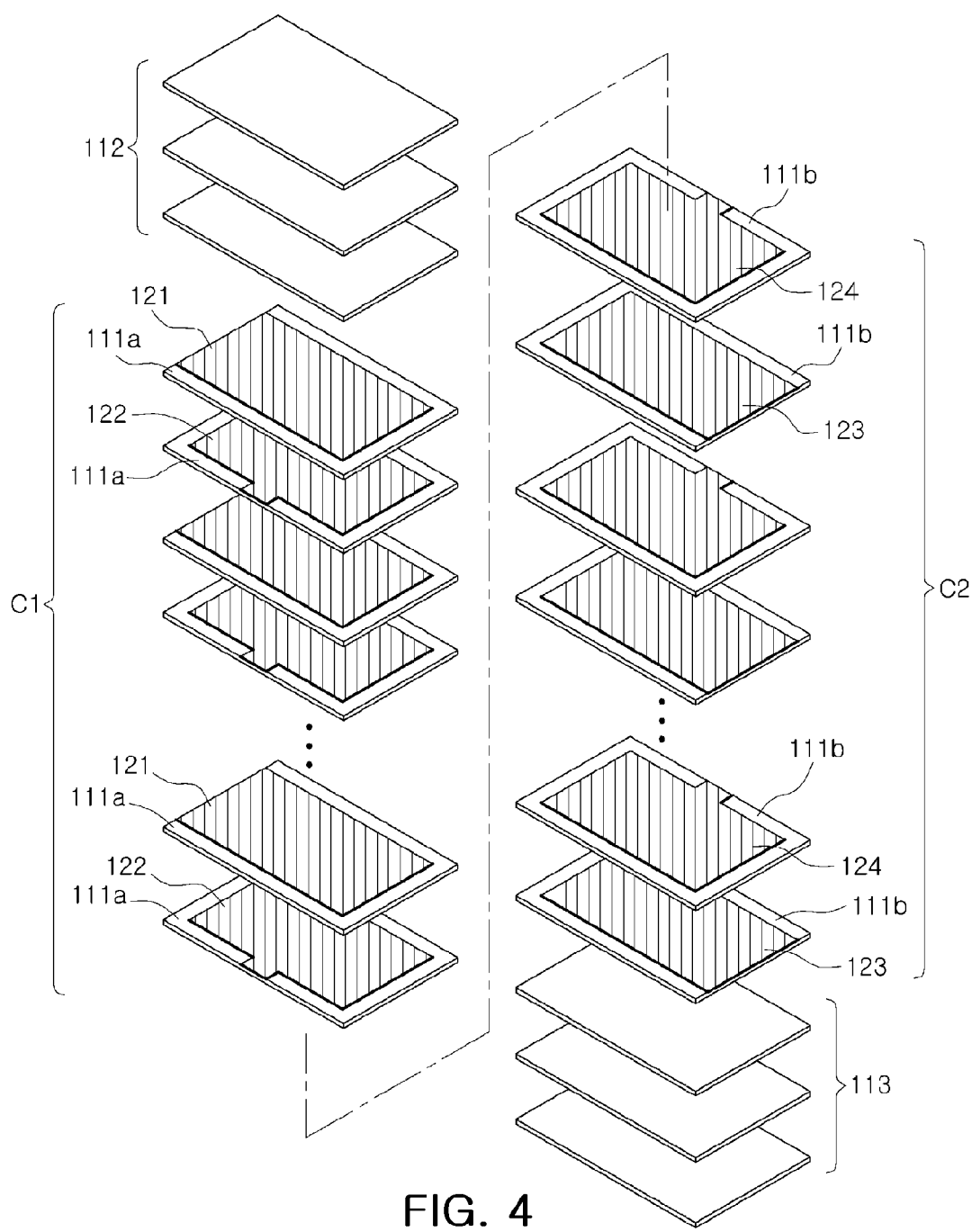
FIG. 4 is an exploded perspective diagram of a ceramic body of an array-type multilayer ceramic electronic component according to an exemplary embodiment of the present disclosure.

FIG. 3 is a perspective diagram schematically showing a ceramic body of an array-type multilayer ceramic electronic component according to an exemplary embodiment of the present disclosure, and FIG. 4 is an exploded perspective diagram of a ceramic body of an array-type multilayer ceramic electronic component according to an exemplary embodiment of the present disclosure.

Referring to FIG. 1, in an array-type multilayer ceramic electronic component according to an exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers are stacked, for example, a 'stacking direction'.

Referring to FIGS. 1 through 4, the array-type multilayer ceramic electronic component 100 according to an exemplary embodiment of the present disclosure may include a ceramic body 110, first and second internal electrodes 121 and 122, third and fourth internal electrodes 123 and 124, a first external electrode 131, a second external electrode 132, a third external electrode 133 and a fourth external electrode 134. The ceramic body 110 may be formed by stacking a plurality of first and second dielectric layers 111a and 111b (see FIG. 2) in the thickness direction and have first and second main surfaces 1 and 2 (see FIG. 3) opposing each other in the thickness direction, first and second side surfaces 3 and 4 opposing each other in the width direction, and first and second end surfaces 5 and 6 opposing each other in the length direction. The first and second internal electrodes 121 and 122 may be formed on the plurality of first dielectric layers 111a and disposed to face each other, having a first dielectric layer therebetween. The third and fourth internal electrodes 123 and 124 may be formed on the plurality of second dielectric layers 111b and disposed to face each other, having a second dielectric layer therebetween. The first external electrode 131 may be formed on the first end surface 5 of the ceramic body and connected to the first internal electrode 121. The second external electrode 132 may be formed on the first side surface 3 of the ceramic body and connected to the second internal electrode 122. The third external electrode 133 may be formed on the second end surface 6 of the ceramic body and connected to the third internal electrode 123. The fourth external electrode 134 may be formed on the second side surface 4 of the ceramic body and connected to the fourth internal electrode 124.

In an exemplary embodiment of the present disclosure, a shape of the ceramic body 110 is not particularly limited, but may be a hexahedral shape as shown in the accompanying drawing.

In an exemplary embodiment of the present disclosure, the ceramic body 110 may have the first and second main surfaces 1 and 2 opposing each other in the thickness T direction, the first and second side surfaces 3 and 4 opposing each other in the width W direction, and the first and second end surfaces 5 and 6 opposing each other in the length L direction. The first and second main surfaces may be upper and lower surfaces of the ceramic body 110, respectively.

When a thickness of the ceramic body, e.g., a length in the thickness T direction, is defined as Tb, and a width of the ceramic body, e.g., a length in the width W direction, is defined as Wb, Tb may be more than Wb (Tb>Wb), but is not limited thereto. When Tb is more than Wb (Tb>Wb) in the ceramic body, the number of stacked dielectric layers and internal electrodes may be relatively increased, such that an array-type multilayer ceramic electronic component having high capacitance may be provided.

According to an exemplary embodiment of the present disclosure, a raw material forming the first and second dielectric layers 111a and 111b is not particularly limited as long as sufficient capacitance may be obtained, but may be, for example, barium titanate ($BaTiO_3$) powder.

The material forming the first and second dielectric layers 111a and 111b may further contain various ceramic additives such as transition metal oxides or carbides, a rare earth element, magnesium (Mg), aluminum (Al), or the like, an organic solvent, a plasticizer, a binder, a dispersant, and the like, according to the purpose of the present disclosure, in addition to the barium titanate ($BaTiO_3$) powder, or the like.

As shown in FIG. 4, the plurality of second dielectric layers 111b may be formed below the plurality of first dielectric layers 111a. For example, after the plurality of second dielectric layers are stacked in the thickness direction, the plurality of first dielectric layers may be stacked on upper portions of the stacked second dielectric layer in the thickness direction.

Referring to FIG. 4, dielectric layers 112 and 113 on which an internal electrode is not formed may be stacked on the uppermost one of the first dielectric layers 111a in the thickness direction and the lowermost one of the second dielectric layers 111b in the thickness direction, and may configure upper and lower cover layers of the ceramic body, respectively.

A material forming the first to fourth internal electrodes 121 to 124 is not particularly limited. For example, the first to fourth internal electrodes 121 to 124 may be formed using a conductive paste formed of one or more of a noble metal such as palladium (Pd), a palladium-silver (Pd—Ag) alloy, or the like, nickel (Ni), and copper (Cu).

The first and second internal electrodes 121 and 122 may be stacked to face each other, having one of the first dielectric layers 111a therebetween, and the third and fourth internal electrodes 123 and 124 may be stacked to face each other, having one of the second dielectric layers 111b therebetween.

Referring to FIGS. 1-3, the first external electrode 131 may be connected to the first internal electrode 121 and formed on the first end surface 5 (see FIG. 3) of the ceramic body 110, and the second external electrode 132 (see FIG. 1) may have a polarity different from that of the first external electrode, be connected to the second internal electrode 122, and be formed on the first side surface 3 of the ceramic body 110.

The third external electrode 133 may have the same polarity as that of the first external electrode 131, be connected to the third internal electrode 123, and be formed on the second end surface 6 of the ceramic body 110. The fourth external electrode 134 may have a polarity different from that of the third external electrode 133, be connected to the fourth internal electrode 124, and be formed on the second side surface 4 of the ceramic body 110.

The first to fourth external electrodes 131 to 134 may extend to at least a portion of the second main surface 2, a mounting surface, to facilitate mounting of a capacitor on aboard.

The first external electrode 131 may enclose all corners and edges where the first end surface 5 connects the first and second main surfaces 1 and 2 and the first and second side surfaces 3 and 4 to extend from the first end surface 5 to the first and second main surfaces 1 and 2 and the first and second side surfaces 3 and 4. In addition, the third external electrode 133 may enclose all corners and edges where the second end surface 6 connects the first and second main surfaces and the first and second side surfaces to extend from the second end surface 6 to the first and second main surfaces 1 and 2 and the first and second side surfaces 3 and 4.

The second external electrode 132 may have a polarity different from that of the first and third external electrodes 131 and 133 and be spaced apart from the first and third external electrodes 131 and 133 by a predetermined interval to be disposed between the first and third external electrodes 131 and 133. The fourth external electrode 134 may have a polarity different from that of the first and third external electrodes 131 and 133 and be spaced apart from the first and third external electrodes 131 and 133 by a predetermined interval to be disposed between the first and third external electrodes 131 and 133.

The second external electrode 132 may be formed on the first side surface 3 and may extend from the first side surface 3 to the first and second main surfaces 1 and 2. The fourth external electrode 134 may be formed on the second side surface 4 and may extend from the second side surface 4 to the first and second main surfaces 1 and 2.

The first to fourth external electrodes 131 to 134 may be formed of the same conductive material as that of the first to fourth internal electrodes 121 to 124, but are not limited thereto. For example, the first to fourth external electrodes 131 to 134 may be formed of one or more conductive metals selected from copper (Cu), silver (Ag), nickel (Ni), and alloys thereof.

The first to fourth external electrodes 131 to 134 may be formed by applying a conductive paste prepared by adding glass frits to the conductive metal powder and then sintering the applied conductive paste.

Figure 5A:
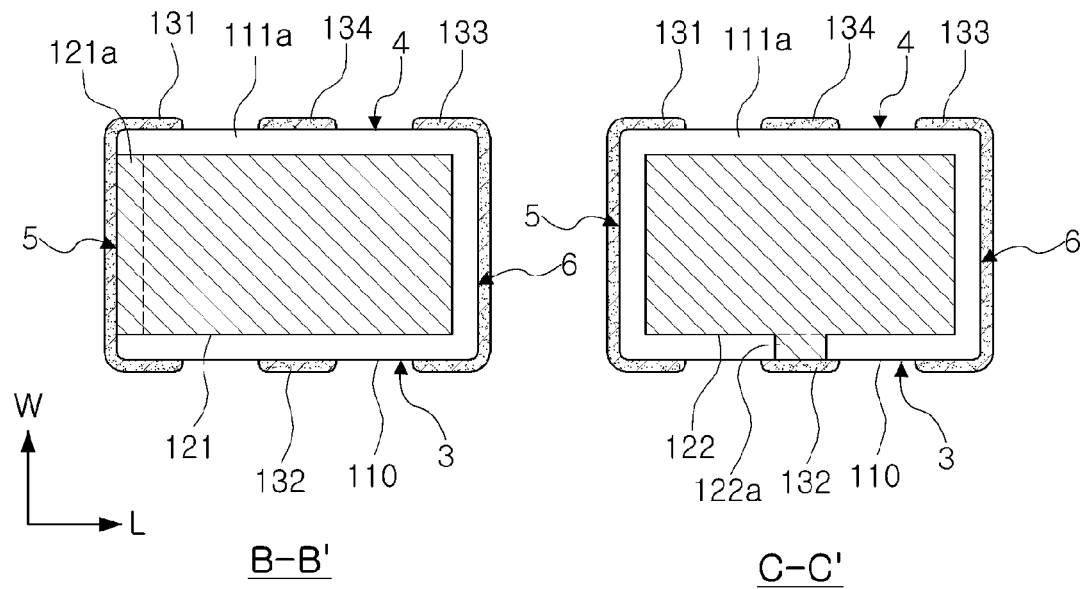
FIGS. 5A and 5B are cross-sectional diagrams taken along lines B-B', C-C', D-D', and E-E' of FIG. 2.
Figure 5B:
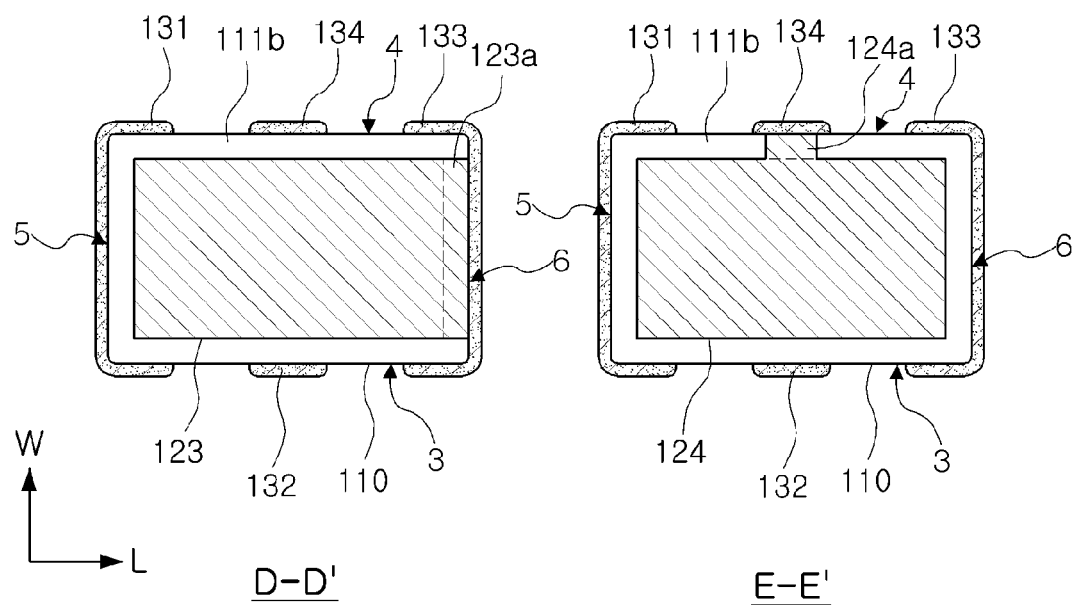

FIGS. 5A and 5B, cross-sectional diagrams taken along lines B-B', C-C', D-D', and E-E' of FIG. 2, are plan views showing shapes of the first to fourth internal electrodes 121 to 124 according to an exemplary embodiment of the present disclosure.

Figure 6:
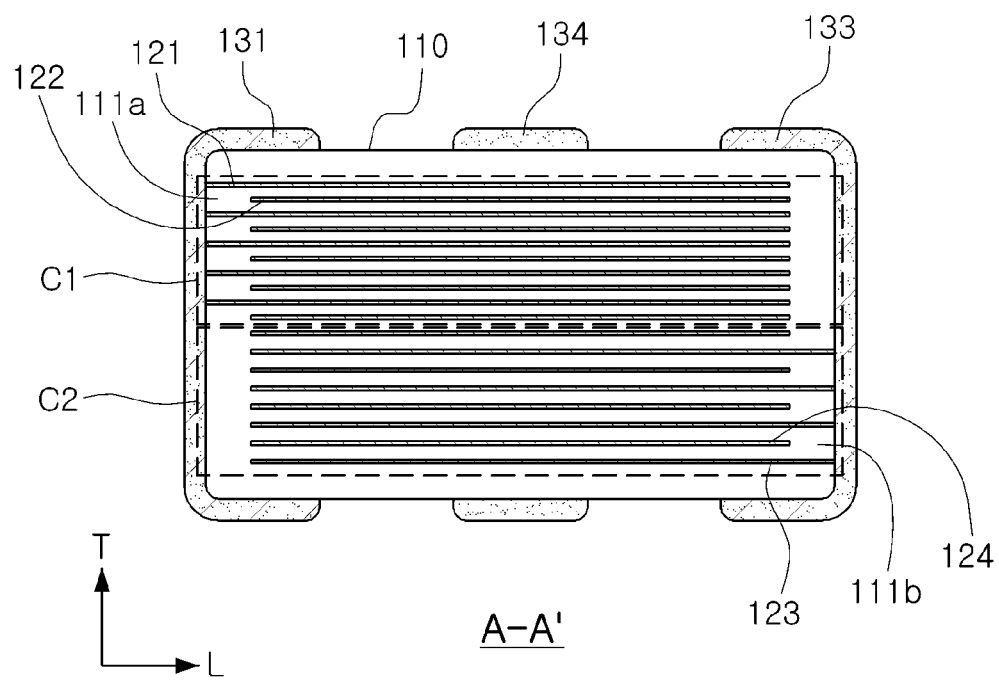
FIG. 6 is a cross-sectional diagram taken along line A-A' of FIG. 1, illustrating first and second capacitor parts.

FIG. 6, a cross-sectional diagram taken along line A-A' of FIG. 1, shows first and second capacitor parts.

Referring to FIGS. 5A and 5B, in the ceramic body 110, the first and second internal electrodes 121 and 122 may be alternately formed on the first dielectric layers 111a, and the third and fourth internal electrodes 123 and 124 may be alternately formed on the second dielectric layers 111b. Each of the internal electrodes 121 to 124 may be divided into a main portion and a lead portion (in FIGS. 5A and 5B, for convenience of understanding, a boundary portion between the main portion and the lead portion is shown by a dotted line). 'The main portion' of the internal electrode, a portion in which the first and second internal electrodes or the third and fourth internal electrodes facing each other in the stacked direction are overlapped with each other, is a main portion contributing to capacitance, and 'the lead portion' of the internal electrode is a portion extending from the main portion to be connected to the external electrode.

According to an exemplary embodiment of the present disclosure, as shown in FIG. 5A, the first internal electrode 121 may include a first lead portion 121a exposed to the first end surface 5 of the ceramic body 110 and connected to the first external electrode 131.

Further, the second internal electrode 122 may include a second lead portion 122a exposed to the first side surface 3 and connected to the second external electrode 132.

Referring to FIG. 5B, the third internal electrode 123 may include a third lead portion 123a exposed to the second end surface 6 and connected to the third external electrode 133.

Further, the fourth internal electrode 124 may include a fourth lead portion 124a exposed to the second side surface 4 and connected to the fourth external electrode 134.

As shown in FIG. 6, the first dielectric layers 111a and the first and second internal electrodes 121 and 122 may form a first capacitor part C1, and the second dielectric layers 111b and the third and fourth internal electrodes 123 and 124 may form a second capacitor part C2. The second capacitor part C2 may be disposed below the first capacitor part C1 in the thickness direction.

An upper cover layer may be disposed on an upper side of the first capacitor part, and a lower cover layer may be disposed on a lower side of the second capacitor part.

In addition, the ceramic body 110 may be seen as a body in which the first capacitor part C1 and the second capacitor part C2 are coupled to each other.

Meanwhile, the first capacitor part C1 and the second capacitor part C2 may independently operate.

The first capacitor part C1 and the second capacitor part C2 may have the same capacitance as each other.

According to an exemplary embodiment of the present disclosure, the first capacitor part C1 and the second capacitor part C2 may be configured to have different numbers of stacked dielectric layers and internal electrodes from each other to have different capacitance. In other words, the number of stacked first dielectric layers 111a included in the first capacitor part and the number of stacked second dielectric layers 111b included in the second capacitor part may be different from each other, and accordingly, the number of stacked first and second internal electrodes 121 and 122 and the number of stacked third and fourth internal electrodes 123 and 124 may be different from each other, such that the first and second capacitor parts C1 and C2 may have different capacitance.

In addition, the first and second capacitor parts C1 and C2 may have different capacitance by allowing the first and second dielectric layers to have different thicknesses or contain different materials.

For example, each of the first and second capacitor parts may include a dielectric layer using a barium titanate base material having high permittivity, as needed. Alternatively, each of the first and second capacitor parts may include a dielectric layer using a dielectric material having low permittivity as a main raw material.

In addition, the first and second capacitor parts may include dielectric layers of which all are formed of the same material and have the same thickness and permittivity or may include dielectric layers of which some or all are formed of different materials and have different permittivity.

As another example, the first and second capacitor parts may be configured in consideration of capacitance so that a high capacitance capacitor part includes a dielectric layer using the dielectric material having relatively high permittivity, and a low capacitance capacitor part includes a dielectric layer using the dielectric material having relatively low permittivity.

However, in the case of the capacitor part according to the present disclosure, for example, even in the case of the high capacitance capacitor part, the capacitor part may have various shapes and structures, for example, by increasing the number of stacked dielectric layers while using a dielectric layer having low permittivity in order to increase an equivalent series resistance (ESR) value.

Therefore, according to an exemplary embodiment of the present disclosure, a plurality of capacitor parts having different capacitance may be implemented in a single chip by adjusting the number of stacked dielectric layers and internal electrodes in each of the capacitor parts.

Figure 7:
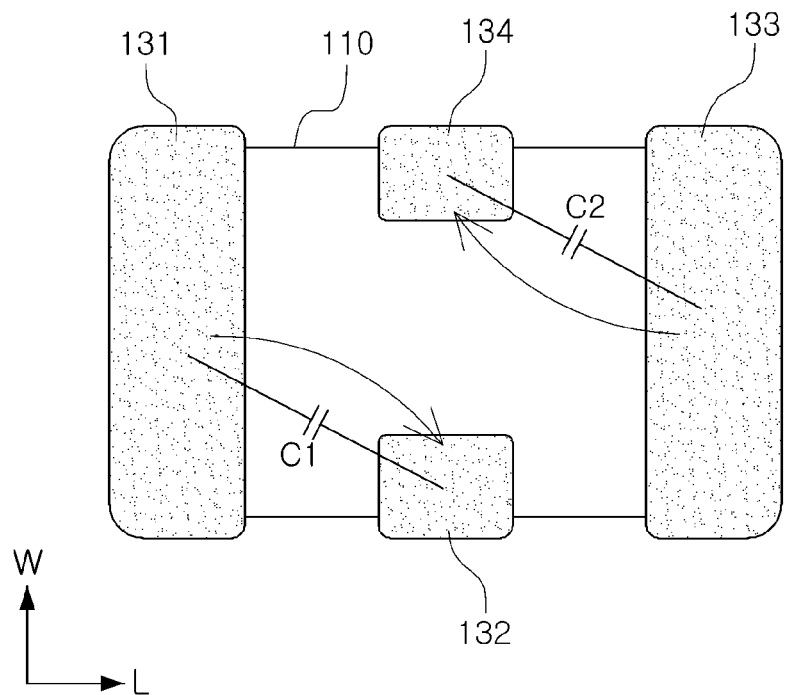
FIG. 7 is a plan view showing a current path of an array-type multilayer ceramic electronic component according to an exemplary embodiment of the present disclosure.

FIG. 7 is a plan view showing a current path of an array-type multilayer ceramic electronic component according to an exemplary embodiment of the present disclosure.

As shown in FIG. 7, the first capacitor part C1 may have a current path connecting the first and second external electrodes 131 and 132 to each other, and the second capacitor part C2 may have a current path connecting the third and fourth external electrodes 133 and 134 to each other.

According to an exemplary embodiment of the present disclosure, a pair of the external electrodes (e.g., the electrodes 131 and 132) formed on each of the capacitor parts are disposed on surfaces of the ceramic body adjacent to each other instead of surfaces of the ceramic body opposing each other, such that the current path may be decreased, thereby decreasing the equivalent series resistance (ESR) value of the respective capacitor parts.

According to an exemplary embodiment of the present disclosure, the first and third external electrodes 131 and 133 may be signal electrodes supplied with current from the outside, and the second and fourth external electrodes 132 and 134 may be ground electrodes for grounding.

When the first and third external electrodes 131 and 133 are signal electrodes and the second and fourth external electrodes 132 and 134 are ground electrodes, in the first capacitor part, current may flow from the first external electrode 131 to the second external electrode 133 to form capacitance, and in the second capacitor part, current may flow from the third external electrode 132 to the fourth external electrode 134 to form capacitance. In this case, as shown in FIG. 7, current directions of the first and second capacitor parts may be opposite to each other. The current of the first and second capacitor parts may be formed in directions opposite to each other, such that magnetic fields by respective currents may be offset to each other. Therefore, equivalent series inductance (ESR) of the array-type multilayer ceramic electronic component may be decreased.

Meanwhile, as shown in FIG. 6, among the first and second internal electrodes 121 and 122 included in the first capacitor part C1, the lowermost internal electrode of the first capacitor part may be a second internal electrode, and among the third and fourth internal electrodes 123 and 124 included in the second capacitor part C2, the uppermost internal electrode of the second capacitor part may be a fourth internal electrode.

In addition, according to an exemplary embodiment of the present disclosure, the lowermost second internal electrode of the first capacitor part and the uppermost fourth internal electrode of the second capacitor part, as described above, may be disposed to face each other, having the dielectric layer therebetween.

Generally, when the first and second capacitor parts are stacked in the thickness direction, in order to prevent parasitic capacitance from being formed between the first and second capacitor parts, a buffer layer on which an internal electrode is not formed needs to be disposed between the first and second capacitor parts.

However, according to an exemplary embodiment of the present disclosure, the second and fourth internal electrodes 122 and 124 connected to the ground electrodes 132 and 134, respectively, are disposed adjacent to each other in a region in which the first and second capacitor parts contact each other, such that formation of the buffer layer between the first and second capacitor parts C1 and C2 may be omitted.

When internal electrodes having different polarities are disposed to face each other, having a dielectric layer therebetween, capacitance may be formed. In addition, unlike the exemplary embodiment of the present disclosure, in the case in which a lowermost internal electrode of a first capacitor part and an uppermost internal electrode of a second capacitor part have different polarities, parasitic capacitance may be formed. When a thick buffer layer is formed between the first and second capacitor parts in order to prevent this parasitic capacitance from being formed, a thickness of a ceramic body may be increased.

However, according to an exemplary embodiment of the present disclosure, the second internal electrode disposed on a bottom portion of the first capacitor part, the fourth internal electrode disposed on a top portion of the second capacitor part, and one dielectric layer (may be formed to have a thickness similar to that of the first or second dielectric layer) present therebetween may not generate parasitic capacitance, and may serve as a buffer layer, while the buffer layer may actually be omitted.

Figure 8:
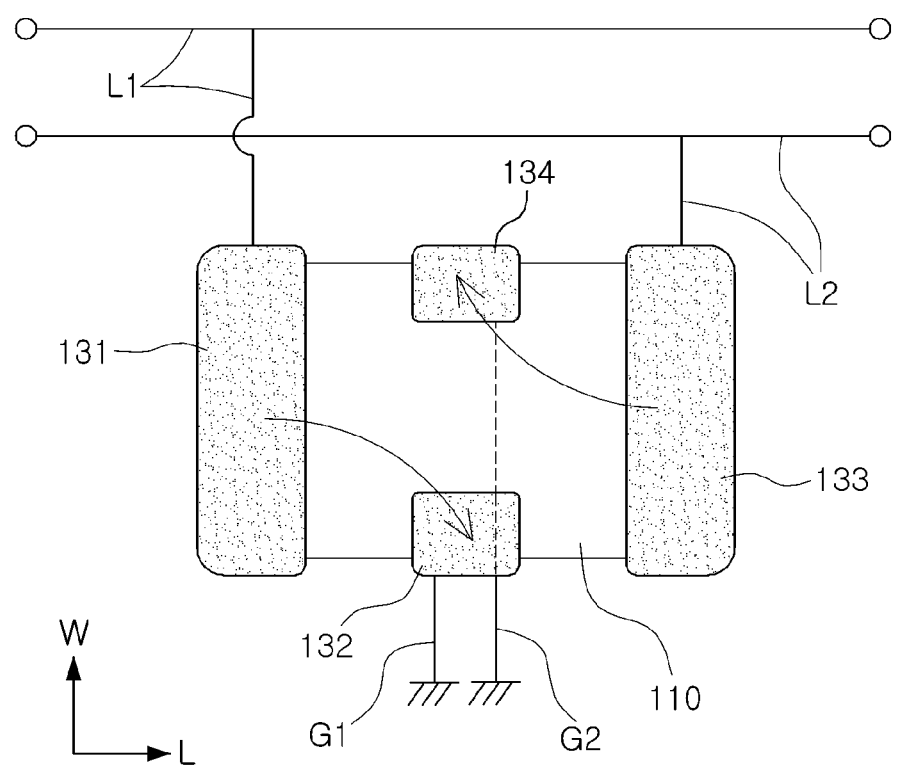
FIG. 8 is a diagram for describing a connection structure with a circuit wiring of an array-type multilayer ceramic electronic component according to an exemplary embodiment of the present disclosure.

FIG. 8 is a diagram for describing a circuit wiring connection structure of an array-type multilayer ceramic electronic component according to an exemplary embodiment of the present disclosure.

According to an exemplary embodiment of the present disclosure, as shown in FIG. 8, even when an array-type multilayer ceramic electronic component according to the present disclosure is connected to two signal wirings parallel to each other, the array-type multilayer ceramic electronic component may be connected to a circuit without bending a wiring pattern.

Hereinafter, a manufacturing method of an array-type multilayer ceramic electronic component according to an exemplary embodiment of the present disclosure will be described.

First, a plurality of first and second ceramic sheets may be prepared.

The first and second ceramic sheets, which are to form first and second dielectric layers of a ceramic body, may be manufactured by mixing ceramic powder, a binder, a solvent, and the like, to prepare a slurry and manufacturing the prepared slurry as a sheet having a thickness of several μm by a doctor blade method, or the like.

Next, first and second internal electrodes may be formed by printing a conductive paste on one surfaces of the first ceramic sheets to be a predetermined thickness, respectively, and third and fourth internal electrodes may be formed by printing a conductive paste on one surfaces of the second ceramic sheets to be a predetermined thickness, respectively.

As a printing method of the conductive paste, a screen printing method, a gravure printing method, or the like, may be used, and the conductive paste may contain metal powder, ceramic powder, silica ($SiO_2$) powder, and the like.

As the metal powder, at least one or more of a noble metal such as silver (Ag), lead (Pb), platinum (Pt), or the like, nickel (Ni), manganese (Mn), chromium (Cr), cobalt (Co), aluminum (Al), copper (Cu), or alloys thereof, may be used.

Then, a plurality of first ceramic sheets on which the first and second internal electrodes are formed may be stacked so that the first and second internal electrodes face each other, having the first ceramic sheet therebetween, and a plurality of second ceramic sheets on which the third and fourth internal electrodes are formed may be stacked so that the third and fourth internal electrodes face each other, having the second ceramic sheet therebetween, so as to form first and second capacitor parts.

In this case, the first and second capacitor parts may be formed to have different capacitance.

In addition, the first and second capacitor parts may be formed using first and second ceramic sheets having different permittivity, respectively. Therefore, at the time of implementing different capacitance in the respective capacitor parts, further various capacitance combinations may be implemented in a single array-type multilayer ceramic electronic component due to the difference in permittivity between the ceramic sheets as described above.

Thereafter, the first and second capacitor parts may be stacked and pressed in the thickness direction, thereby preparing a multilayer body including a plurality of capacitor parts disposed in the thickness direction.

Next, the multilayer body may be cut into portions corresponding to respective single chips to then be sintered, thereby preparing a ceramic body having first and second main surfaces opposing each other in the thickness direction and first and second end surfaces opposing each other in a length direction. The ceramic body may include the first to fourth internal electrodes exposed to the first end surface, the first side surface, the second end surface, and second side surface, respectively.

Then, first and third external electrodes may be formed on the first and second end surfaces of the ceramic body so as to be connected to the first and third internal electrodes, respectively, and second and fourth external electrodes may be formed on the first and second side surfaces of the ceramic body so as to be connected to the second and fourth internal electrodes, respectively.

In this case, the first to fourth external electrodes may extend to a portion of the first or second main surface of the ceramic body for mounting.

Further, the first to fourth external electrodes may extend to portions of the first and second main surfaces of the ceramic body so that directivity of the mounting surface does not need to be considered at the time of mounting the electronic component on a board by removing directivity of the electronic component.

Meanwhile, a plating layer may be further formed on the mounting surface of the first to fourth external electrodes, as needed. The plating layer may be to increase adhesion strength between a completed array-type multilayer ceramic electronic component and a printed circuit board at the time of mounting the completed array-type multilayer ceramic electronic component on the printed circuit board using solder.

Figure 9:
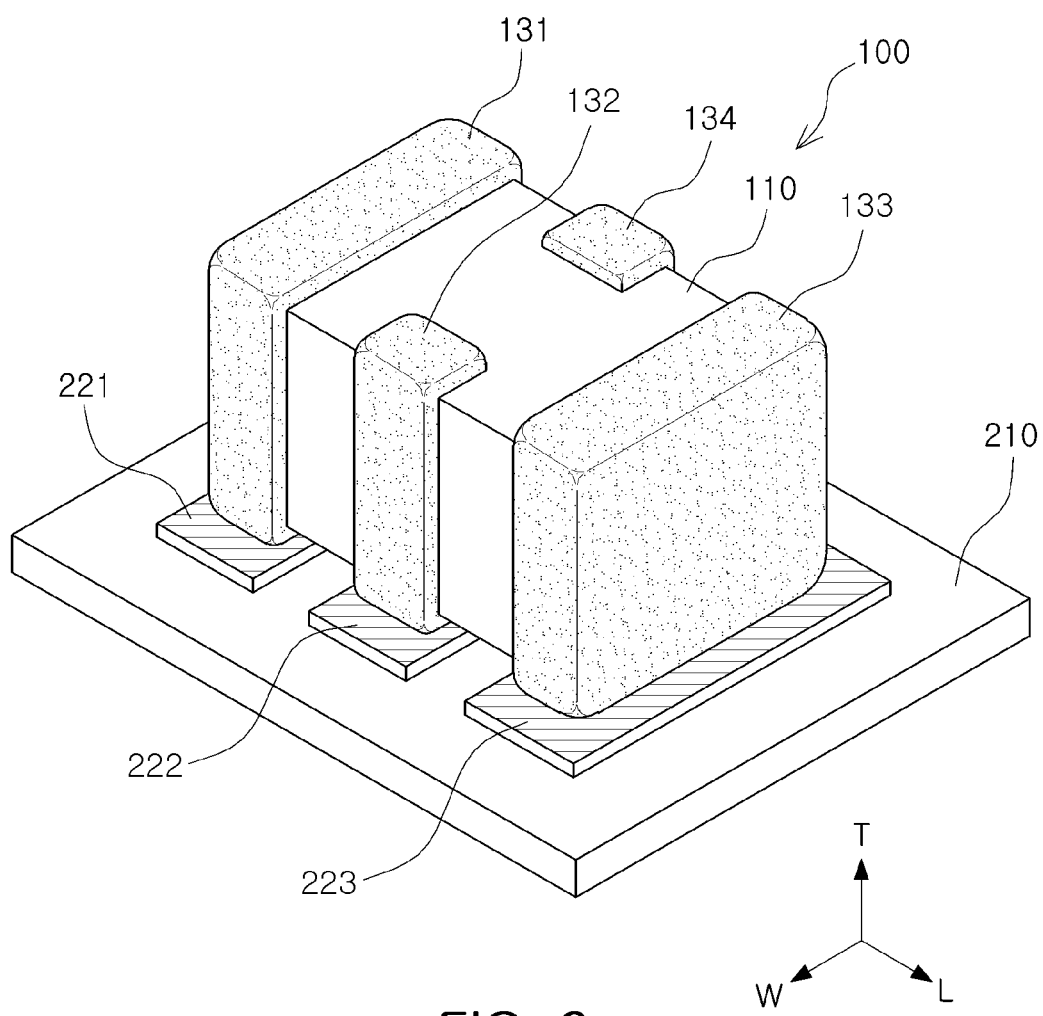
FIG. 9 is a perspective diagram schematically showing a form in which an array-type multilayer ceramic electronic component according to an exemplary embodiment of the present disclosure is mounted on a printed circuit board.
Figure 10:
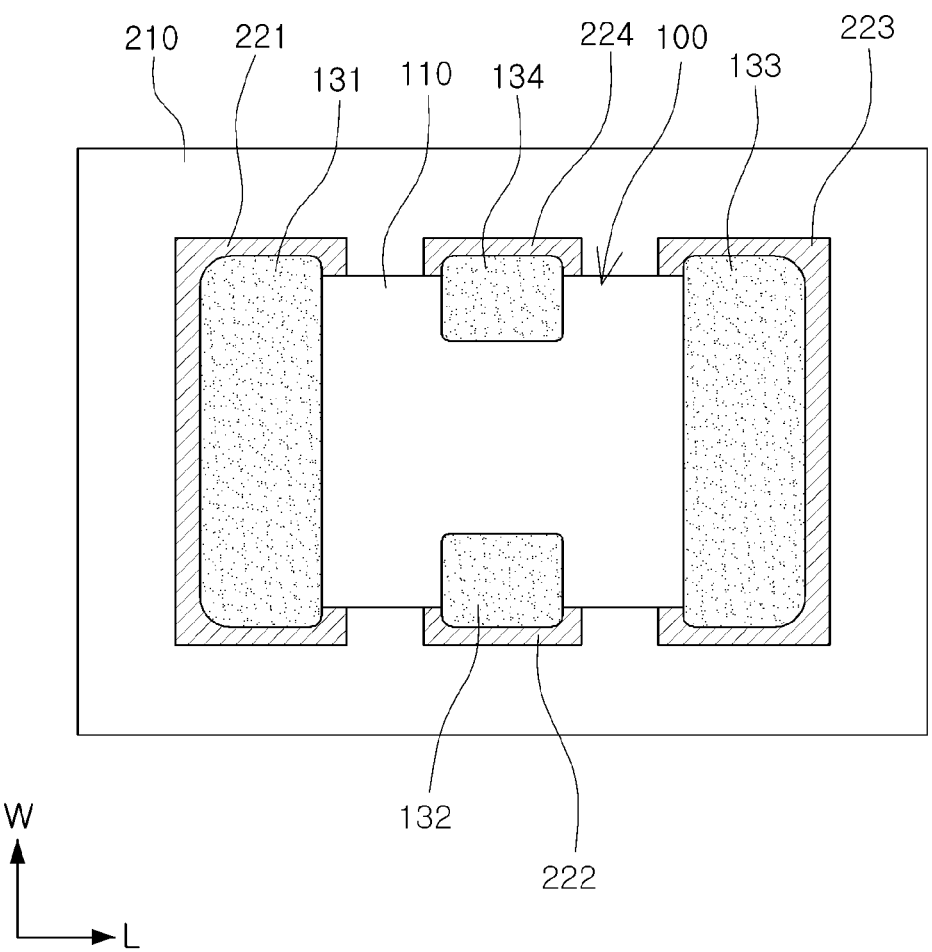
FIG. 10 is a plan view of FIG. 9.

Board 200 Having Array-Type Multilayer Ceramic Electronic Component Mounted Thereon FIG. 9 is a perspective diagram schematically showing a form in which an array-type multilayer ceramic electronic component according to an exemplary embodiment of the present disclosure is mounted on a printed circuit board, and FIG. 10 is a plan view of FIG. 9.

Referring to FIGS. 9 and 10, a board 200 having an array-type multilayer ceramic electronic component 100 mounted thereon according to an exemplary embodiment may include a printed circuit board 210 on which the array-type multilayer ceramic electronic component 100 is mounted, and three or more electrode pads 221 to 224 formed on the printed circuit board 210.

The electrode pad may include first to fourth electrode pads 221 to 224 connected to the first to fourth external electrodes 131 to 134 of the array-type multilayer ceramic electronic component, respectively.

For example, the first and third electrode pads 221 and 223 may be connected to first and second signal electrodes, respectively, and the second and fourth electrode pads 222 and 224 may be connected to first and second ground electrodes, respectively.

In this case, the array-type multilayer ceramic electronic component may be electrically connected to the printed circuit board 210 by soldering in a state in which the first to fourth external electrodes thereof are positioned on, and in contact with, the first to fourth electrode pads, respectively.

In further detail, according to an exemplary embodiment of the present disclosure, the second and fourth electrode pads connected to the first and second ground electrodes may be connected to each other so as to be formed as a single electrode pad.

Another Embodiment 1

Figure 11:
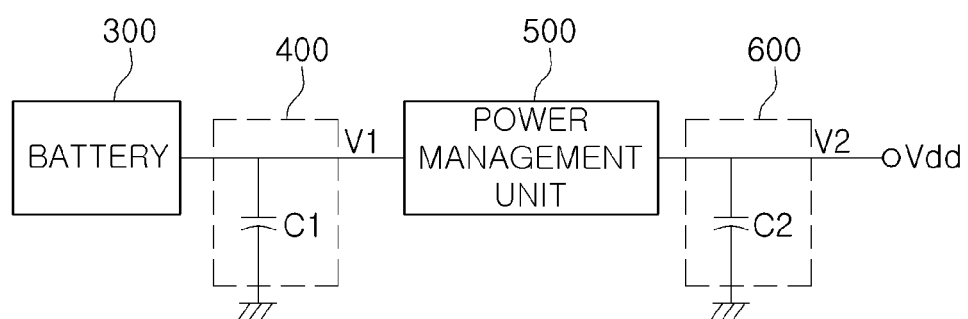
FIG. 11 is a circuit diagram of a driving power supply system according to another exemplary embodiment of the present disclosure.

FIG. 11 is a circuit diagram showing a driving power supply system supplying driving power to a predetermined terminal requiring driving power via a battery and a power management unit.

Referring to FIG. 11, the driving power supply system may include a battery 300, a first power stabilization unit 400, a power management unit 500, and a second power stabilization unit 600.

The battery 300 may supply power to the power management unit 500. Here, power supplied to the power management unit 500 by the battery 300 will be defined as first power.

The first power stabilization unit 400 may stabilize the first power V1 and may supply the stabilized first power to the power management unit 500. In detail, the first power stabilization unit 400 may include a first capacitor part C1 formed between a connection terminal between the battery 300 and the power management unit 500 and the ground. The first capacitor part C1 may decrease noise included in the first power.

In addition, the first capacitor C1 may charge electric charges. Further, when the power management unit 500 instantaneously consumes a large amount of current, the first capacitor part C1 may discharge the charged electric charges to suppress a voltage of the power management unit 500 from being changed.

In addition, the first capacitor part C1 may be a capacitor having a high capacitance.

The power management unit 500 may serve to convert power supplied to an electronic device so as to be suitable for the electronic device and distribute, charge, and control the power. Therefore, the power management unit 500 may generally include a DC/DC converter.

In addition, the power management unit 500 may be implemented as a power management integrated circuit (PMIC).

Alternatively, the power management unit 500 may be implemented as a low dropout regulator (LDO).

The power management unit 500 may convert the first power V1 into second power V2. The second power V2 may be power required by a predetermined device connected to an output terminal of the power management unit 500 to be supplied with driving power.

The second power stabilization unit 600 may stabilize the second power V2 and may supply the stabilized second power to an output terminal $V_{dd}$. A predetermined device supplied with the driving power from the power management unit 500 may be connected to the output terminal $V_{dd}$.

The second power stabilization unit 600 may include a second capacitor part C2 formed between a connection terminal between the power management unit 500 and the output terminal $V_{dd}$ and the ground.

The second power stabilization unit 600 may decrease noise included in the second power V2. Further, the second power stabilization unit 600 may stably supply power to the output terminal $V_{dd}$. In addition, the second capacitor part C2 may be a capacitor having a high capacitance.

In the array-type multilayer ceramic electronic component 100 according to an exemplary embodiment of the present disclosure, the first and second capacitor parts C1 and C2 may be configured as a single chip. Therefore, a degree of integration of the device may be improved, and the wiring may be designed to be relatively short and thick. Further, when two wirings provided to be parallel to each other are connected to the array-type multilayer ceramic electronic component according to the present disclosure, the connection may be performed without bending the wiring.

Another Embodiment 2

Figure 12:
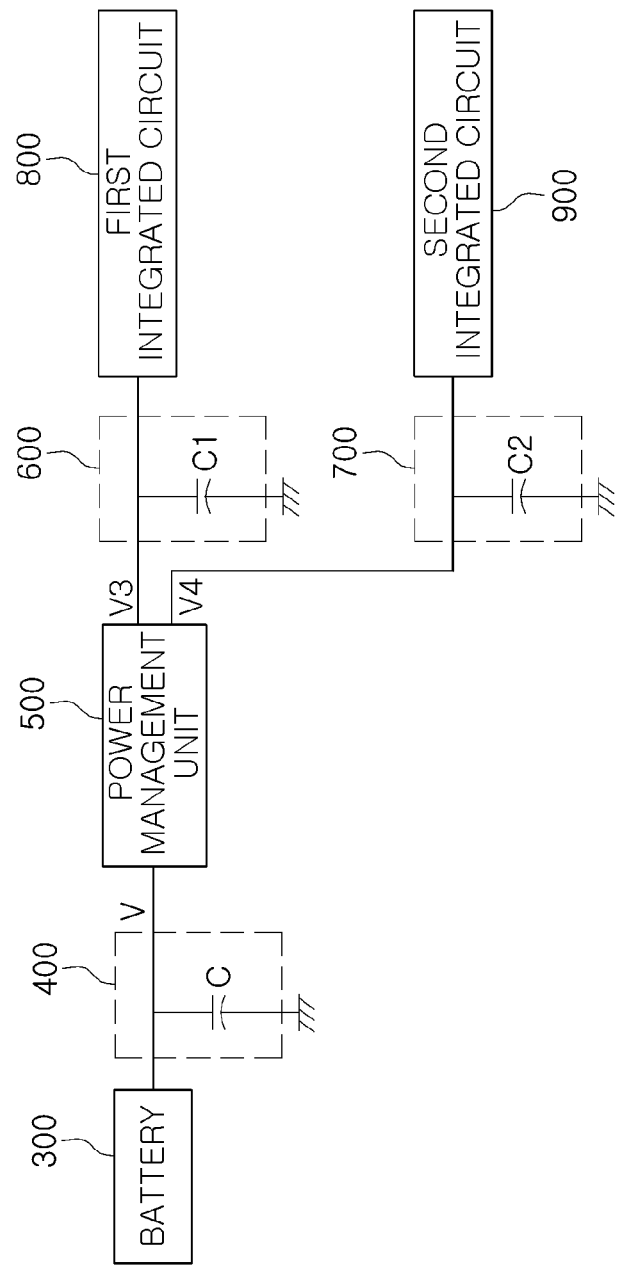
FIG. 12 is a circuit diagram of a driving power supply system according to another exemplary embodiment of the present disclosure.

FIG. 12 is a circuit diagram of a driving power supply system according to another exemplary embodiment of the present disclosure.

Referring to FIG. 12, the driving power supply system may include a battery 300, a first power stabilization unit 400, a power management unit 500, a second power stabilization unit 600, and a third power stabilization unit 700.

The battery 300 may supply power to the power management unit 500.

The first power stabilization unit 400 may stabilize the power V supplied from the battery to the power management unit and may supply the stabilized power to the power management unit 500. In detail, the first power stabilization unit 400 may include a capacitor part C formed between a connection terminal between the battery 300 and the power management unit 500 and a ground. The capacitor part C may decrease noise included in the power V supplied from the battery to the power management unit.

In addition, the capacitor part C may charge electric charges. Further, when the power management unit 500 instantaneously consumes a large amount of current, the capacitor part C may discharge the charged electric charges to suppress a voltage of the power management unit 500 from being changed.

In addition, the capacitor part C may be a capacitance capacitor having a high capacitance.

The power management unit 500 may serve to convert power supplied to an electronic device so as to be suitable for the electronic device and distribute, charge, and control the power. Therefore, the power management unit 500 may generally include a DC/DC converter.

In addition, the power management unit 500 may be implemented as a power management integrated circuit (PMIC).

Alternatively, the power management unit 500 may be implemented as a low dropout regulator (LDO).

The power management unit 500 may convert the power V supplied from the battery to the power management unit into first power V3 and second power V4. The first power V3 and second power V4 may be power required by predetermined devices supplied with driving power, respectively.

The second power stabilization unit 600 may stabilize the first power V3 and may supply the stabilized first power to a first integrated circuit 800. The second power stabilization unit 600 may include a capacitor part C1 formed between the power management unit 500 and the first integrated circuit 800. In this exemplary embodiment, the capacitor part included in the second power stabilization unit may be defined as a first capacitor part C1.

The second power stabilization unit 600 may decrease noise included in the first power V3. Further, the second power stabilization unit 600 may stably supply power to the first integrated circuit 800.

The third power stabilization unit 700 may stabilize the second power V4 and may supply the stabilized second power to a second integrated circuit 900. The third power stabilization unit 700 may include a capacitor part C2 formed between the power management unit 500 and the second integrated circuit 900. In this exemplary embodiment, the capacitor part included in the third power stabilization unit may be defined as a second capacitor part C2.

The third power stabilization unit 700 may decrease noise included in the second power V4. Further, the third power stabilization unit 700 may stably supply power to the second integrated circuit 900.

In addition, the first and second capacitor parts C1 and C2 may be high capacitance capacitors.

In the array-type multilayer ceramic electronic component 100 according to an exemplary embodiment of the present disclosure, the first and second capacitor parts C1 and C2 may be configured as a single chip. Therefore, a degree of integration of the device may be improved, and the wiring may be designed to be relatively short and thick. Further, when two wirings disposed in parallel with each other are connected to the array-type multilayer ceramic electronic component according to the present disclosure, the connection may be performed without bending the wiring.

As set forth above, according to exemplary embodiments of the present disclosure, the plurality of capacitor parts having different capacitance may be coupled to each other in a single ceramic body, such that the mounting area occupied by the device on the board may be decreased.

In addition, according to exemplary embodiments of the present disclosure, the buffer layer between the plurality of capacitor parts may be omitted, such that the thickness of the ceramic body may be decreased, and the parasitic capacitance may be easily controlled.

According to exemplary embodiments of the present disclosure, the current directions of the first and second capacitor parts may be opposite to each other, such that the equivalent series inductance may be decreased.

While exemplary embodiments have been shown and described above, it will be apparent to those skilled in the art that modifications and variations could be made without departing from the spirit and scope of the present disclosure as defined by the appended claims.

What is claimed is:

1. An array-type multilayer ceramic electronic component comprising:
    a body having a hexahedral shape and including a first capacitor part and a second capacitor part coupled to the first capacitor part, wherein the first capacitor part includes a plurality of first dielectric layers, a plurality of first internal electrodes and a plurality of second internal electrodes, and the second capacitor part is disposed below the first capacitor part in a thickness direction and includes a plurality of second dielectric layers, a plurality of third internal electrodes and a plurality of fourth internal electrodes;
    a first signal electrode disposed on a first end surface of the body and connected to the first internal electrodes;
    a first ground electrode disposed on a first side surface of the body and connected to the second internal electrodes;
    a second signal electrode disposed on a second end surface of the body and connected to the third internal electrodes; and
    a second ground electrode disposed on a second side surface of the body and connected to the fourth internal electrodes.

2. The array-type multilayer ceramic electronic component of claim 1, wherein a lowermost internal electrode of the first capacitor part is one of the second internal electrodes, and an uppermost internal electrode of the second capacitor part is one of the fourth internal electrodes.

3. The array-type multilayer ceramic electronic component of claim 1, wherein a lowermost internal electrode of the first capacitor part is one of the second internal electrodes, an uppermost internal electrode of the second capacitor part is one of the fourth internal electrodes, and the lowermost internal electrode of the first capacitor part and the uppermost internal electrode of the second capacitor part face each other, having a dielectric layer therebetween.

4. The array-type multilayer ceramic electronic component of claim 1, wherein the first and second capacitor parts are configured to independently operate.

5. The array-type multilayer ceramic electronic component of claim 1, wherein the first and second capacitor parts have different capacitance.

6. The array-type multilayer ceramic electronic component of claim 1, wherein the first and second capacitor parts have respective current directions opposite to each other.

7. The array-type multilayer ceramic electronic component of claim 1, wherein:
    the first and second internal electrodes are disposed on the plurality of first dielectric layers so as to face each other, having one of the first dielectric layers therebetween, and
    the third and fourth internal electrodes are disposed on the plurality of second dielectric layers so as to face each other, having one of the second dielectric layers therebetween.

8. The array-type multilayer ceramic electronic component of claim 1, wherein:
    the first internal electrodes include a first lead portion exposed to the first end surface,
    the second internal electrodes include a second lead portion exposed to the first side surface, the third internal electrodes include a third lead portion exposed to the second end surface, and the fourth internal electrodes include a fourth lead portion exposed to the second side surface.

9. An array-type multilayer ceramic electronic component comprising:
    a body having a hexahedral shape including a first capacitor part and a second capacitor part coupled to the first capacitor part, wherein the first capacitor part stabilizes first power supplied from a battery to supply the stabilized power to a power management unit, and the second capacitor part is disposed below the first capacitor part, is supplied with second power converted by the power management unit, and stabilizes the supplied second power to supply driving power;

a first signal electrode disposed on a first end surface of the body and connected to the battery to transfer the first power to the first capacitor part;

a second signal electrode disposed on a second end surface of the body and connected to the power management unit to transfer the second power to the second capacitor part;

a first ground electrode disposed on a first side surface of the body to ground the first capacitor part; and a second ground electrode disposed on a second side surface of the body to ground the second capacitor part, wherein:

the first capacitor part includes a plurality of first dielectric layers, and a plurality of first internal electrodes, and a plurality of second internal electrodes, the second capacitor part includes a plurality of second dielectric layers, and a plurality of third internal electrodes, and a plurality of fourth internal electrodes, the first internal electrodes are connected to the first signal electrode, the second internal electrodes are connected to the first ground electrode, the third internal electrodes are connected to the second signal electrode, and the fourth internal electrodes are connected to the second ground electrode.

10. The array-type multilayer ceramic electronic component of claim 9, wherein:

a lowermost internal electrode of the first capacitor part is one of the second internal electrodes, and an uppermost internal electrode of the second capacitor part is one of the fourth internal electrodes.

* * * * *